United States Patent
Bang et al.

(10) Patent No.: US 7,274,614 B2
(45) Date of Patent: Sep. 25, 2007

(54) FLASH CELL FUSE CIRCUIT AND METHOD OF FUSING A FLASH CELL

(75) Inventors: Hoon-Jin Bang, Seoul (KR); Gyu-Hong Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/330,608

(22) Filed: Jan. 12, 2006

(65) Prior Publication Data

US 2006/0171205 A1 Aug. 3, 2006

(30) Foreign Application Priority Data

Jan. 28, 2005 (KR) ............ 10-2005-0008052

(51) Int. Cl.
*G11C 17/18* (2006.01)
(52) U.S. Cl. .............. 365/225.7; 365/185.02; 365/185.21
(58) Field of Classification Search .......... 365/225.7
See application file for complete search history.

(56) References Cited

U.S. PATENT DOCUMENTS

| | | | | |
|---|---|---|---|---|
| 5,748,545 A | * | 5/1998 | Lee et al. ............ | 365/201 |
| 5,973,984 A | * | 10/1999 | Nagaoka ............ | 365/230.03 |
| 6,067,256 A | * | 5/2000 | Yamashita et al. ...... | 365/189.04 |
| 6,564,289 B2 | * | 5/2003 | Srinivasan et al. ........ | 711/108 |
| 6,741,512 B2 | * | 5/2004 | Kim et al. ............ | 365/201 |
| 7,002,828 B2 | * | 2/2006 | Santin et al. ............ | 365/96 |
| 7,102,951 B2 | * | 9/2006 | Paillet et al. ............ | 365/225.7 |
| 2002/0075731 A1 | * | 6/2002 | Amano ............ | 365/196 |
| 2004/0052121 A1 | | 3/2004 | Santin et al. | |

FOREIGN PATENT DOCUMENTS

| | | |
|---|---|---|
| JP | 10-112198 | 4/1998 |
| JP | 2001-273781 | 10/2001 |
| KR | 1999-53150 | 7/1999 |

* cited by examiner

*Primary Examiner*—Amir Zarabian
*Assistant Examiner*—Anthan T Tran
(74) *Attorney, Agent, or Firm*—F. Chau & Assoc., LLC

(57) ABSTRACT

A flash cell fuse circuit includes a fuse cell array, a plurality of switch circuits and a plurality of fuse sense amplifiers. The fuse cell array outputs first signals in response to word line enable signals after a program or erase operation. The switch circuits pass one of the first signals in response to a reset signal and one of the word line enable signals. The fuse sense amplifiers each generate a fuse signal by detecting and amplifying an output signal of a corresponding switch circuit.

18 Claims, 4 Drawing Sheets

US 7,274,614 B2

FLASH CELL FUSE CIRCUIT AND METHOD OF FUSING A FLASH CELL

CROSS-REFERENCE TO RELATED APPLICATION

This application claims priority under 35 U.S.C. § 119 to Korean Patent Application No. 2005-8052, filed on Jan. 28, 2005, the disclosure of which is incorporated by reference herein in its entirety.

BACKGROUND OF THE INVENTION

1. Technical Field

The present invention relates to a flash cell fuse circuit and method of fusing a flash cell, and more particularly to a flash cell fuse circuit and fusing method for preventing cells coupled to a common bit line from being simultaneously activated.

2. Discussion of the Related Art

A flash cell refers to a semiconductor element that is capable of selectively passing or intercepting an electric current. The flash cell may be used as a fuse since it is a nonvolatile element that does not need power to maintain data stored therein. As a result, the flash cell is increasingly being used in place of a conventional metal fuse.

This is so because when a conventional metal fuse is used to store data, the metal fuse has to be cut by using a laser and once the metal fuse is cut it cannot be repaired. Thus, because a flash cell fuse circuit does not require the same procedures for storing data, the flash cell fuse circuit may be provided at a relatively lower cost and may be easier to test than the conventional metal fuse.

FIG. 1 is a circuit diagram illustrating a conventional flash cell fuse circuit. Referring to FIG. 1, the flash cell fuse circuit includes a fuse cell array 100 and fuse sense amplifiers 200 and 300. The fuse cell array 100 includes a first fuse cell array 110 controlled by a first word line W1 and a second fuse cell array 120 controlled by a second word line W2. The first fuse cell array 110 and the second fuse cell array 120 may be used for fusing tasks that are different from each other.

The first fuse cell array 110 includes flash cells C00 and C01 and the second fuse cell array 120 includes flash cells C10 and C11. The flash cells C00 and C10 are coupled to a first bit line B1 and flash cells C01 and C11 are coupled to a second bit line B2. The flash cells C00 and C01 are connected to a source line S1 and the flash cells C10 and C11 are connected to a source line S2. The source lines S1 and S2 are typically connected to ground.

When reading flash cell data that is recorded by a program operation or an erase operation, the flash cells C00 and C01 are activated when the first word line W1 is activated. Data of the flash cell C00 is transferred to the first bit line B1 and output as a first output voltage F01 through the first fuse sense amplifier 200. Data of the flash cell C01 is transferred to the second bit line B2 and output as a second output voltage F02 through the second fuse sense amplifier 300.

In the same way, the flash cells C10 and C11 are activated when the second word line W2 is activated. Data of the flash cell C10 is transferred to the first bit line B1 and output as the first output voltage F01 through the first fuse sense amplifier 200. Data of the flash cell C11 is transferred to the second bit line B2 and output as the second output voltage F02 through the second fuse sense amplifier 300. The output voltages F01 and F02 are then applied to respective gates in a circuit block that needs to be fused, thus completing a fusing procedure.

When fuse cells have a configuration in which a word line and a source line are separated while a bit line is shared as shown in FIG. 1, a program operation and an erase operation may be executed separately. In addition, when the bit line is shared, the flash cell fuse circuit may be easily tested, and an integration density of the layout of a flash cell array may be enhanced as compared to a flash cell fuse circuit that has a separated bit line.

However, in the flash cell fuse circuit illustrated in FIG. 1, a flash cell may be inadvertently activated, thus unwanted data may be transferred to the bit line and then output through the fuse sense amplifier. For example, when word line enable signals, which activate the word lines W1 and W2, are simultaneously enabled, the data of the flash cells C00 and C10 are transferred to the bit line B1 at the same time. Thus, if the word line W2 is inadvertently activated, unwanted data may be transferred to the bit line B1 and output as the first output voltage F01 instead of the data of the flash cell C00.

Therefore, a need exists for a flash cell fuse circuit that is capable of preventing flash cells coupled to a common bit line from being simultaneously activated.

SUMMARY OF THE INVENTION

A flash cell fuse circuit and fusing method that may prevent cells, which are coupled to a common bit line, from being simultaneously activated and a flash cell fuse circuit that may output correct data of a desired cell in a fuse cell array are provided.

In an embodiment of the present invention, a flash cell fuse circuit includes a fuse cell array, a plurality of switch circuits and a plurality of fuse sense amplifiers. The fuse cell array outputs first signals in response to word line enable signals after a program or erase operation. The switch circuits pass one of the first signals in response to a reset signal and one of the word line enable signals. The fuse sense amplifiers each generate a fuse signal by detecting and amplifying an output signal of a corresponding switch circuit. The word line enable signals may be sequentially enabled.

The fuse cell array may include a plurality of bit lines, a plurality of word lines, and a plurality of flash cells, in which a gate of each of the flash cells is coupled to a corresponding word line and a drain of each of the flash cells is coupled to a corresponding bit line.

Each of the switch circuits may include a NAND gate for performing a NAND operation on the reset signal and one of the word line enable signals, an inverter for inverting an output signal of the NAND gate and a transfer gate for passing one of the first signals in response to the inverted output signal of the NAND gate.

In another embodiment of the present invention, a flash cell fuse circuit includes a fuse cell array, a first switch circuit, a second switch circuit, a first fuse sense amplifier and a second fuse sense amplifier. The fuse cell array outputs a first signal and a second signal in response to a first word line enable signal and a second word line enable signal after a program or erase operation. The first switch circuit passes the first signal in response to a reset signal and the first word line enable signal, while the second switch circuit passes the second signal in response to the reset signal and the second word line enable signal. The first fuse sense amplifier generates a first fuse signal by detecting and amplifying an output signal of the first switch circuit, while the second fuse sense amplifier generates a second fuse signal by detecting and amplifying an output signal of the second switch circuit. The first and second word line enable signals may be sequentially enabled.

The fuse cell array includes a first bit line, a second bit line, a first word line activated in response to the first word line enable signal, a second word line activated in response to the second word line enable signal, a first flash cell having a gate coupled to the first word line and a drain coupled to the first bit line, and a second flash cell having a gate coupled to the second word line and a drain coupled to the second bit line.

The fuse cell array may also include a third flash cell having a gate coupled to the second word line and a drain coupled to the first bit line, and a fourth flash cell having a gate coupled to the first word line and a drain coupled to the second bit line. A first fuse cell array of the fuse cell array may include the first flash cell and fourth flash cell and a second fuse cell array of the fuse cell array may include the second flash cell and third flash cell.

In addition, the first switch circuit may include a NAND gate for performing a NAND operation on the reset signal and the first word line enable signal, an inverter for inverting an output signal of the NAND gate and a transfer gate for passing the first signal in response to the inverted output signal of the NAND gate. Furthermore, the second switch circuit may include a NAND gate for performing a NAND operation on the reset signal and the second word line enable signal, an inverter for inverting an output signal of the NAND gate and a transfer gate for passing the second signal in response to the inverted output signal of the NAND gate.

In yet another embodiment of the present invention, a method of fusing a flash cell includes outputting first signals in response to word line enable signals after a program or erase operation, passing one of the first signals in response to a reset signal and one of the word line enable signals, and generating a fuse signal by detecting and amplifying the passed first signal. The word line enable signals may be sequentially enabled.

Passing one of the first signals may include outputting a second signal by performing an AND operation on the reset signal and one of the word line enable signals, and passing one of the first signals in response to the second signal. The method further includes determining whether the program or erase operation is to be performed.

In another embodiment of the present invention, a method of fusing a flash cell includes outputting a first signal and a second signal in response to a first word line enable signal and a second word line enable signal after a program or erase operation, passing the first signal in response to a reset signal and the first word line enable signal, passing the second signal in response to the reset signal and the second word line enable signal, generating a first fuse signal by detecting and amplifying the passed first signal, and generating a second fuse signal by detecting and amplifying the passed second signal. The first and second word line enable signals may be sequentially enabled.

Passing the first signal may include outputting a third signal by performing an AND operation on the reset signal and the first word line enable signal, and passing the first signal in response to the third signal. In addition, passing the second signal may include outputting a fourth signal by performing an AND operation on the reset signal and the second word line enable signal, and passing the second signal in response to the fourth signal. The method further includes determining whether the program or erase operation is to be performed.

BRIEF DESCRIPTION OF THE DRAWINGS

The above and other features of the present invention will become more apparent by describing in detail exemplary embodiments thereof with reference to the accompanying drawings. Like reference numbers refer to like elements throughout the drawings.

DESCRIPTION OF EXEMPLARY EMBODIMENTS

Hereinafter, exemplary embodiments of the present invention will be explained in detail with reference to the accompanying drawings. However, specific structural and functional details disclosed herein are merely presented for purposes of describing the exemplary embodiments of the present invention.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on", "connected to" or "coupled to" another element, it can be directly on, connected or coupled to the other element or intervening elements may be present. In contrast, when an element is referred to as being "directly on," "directly connected to" or "directly coupled to" another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1:
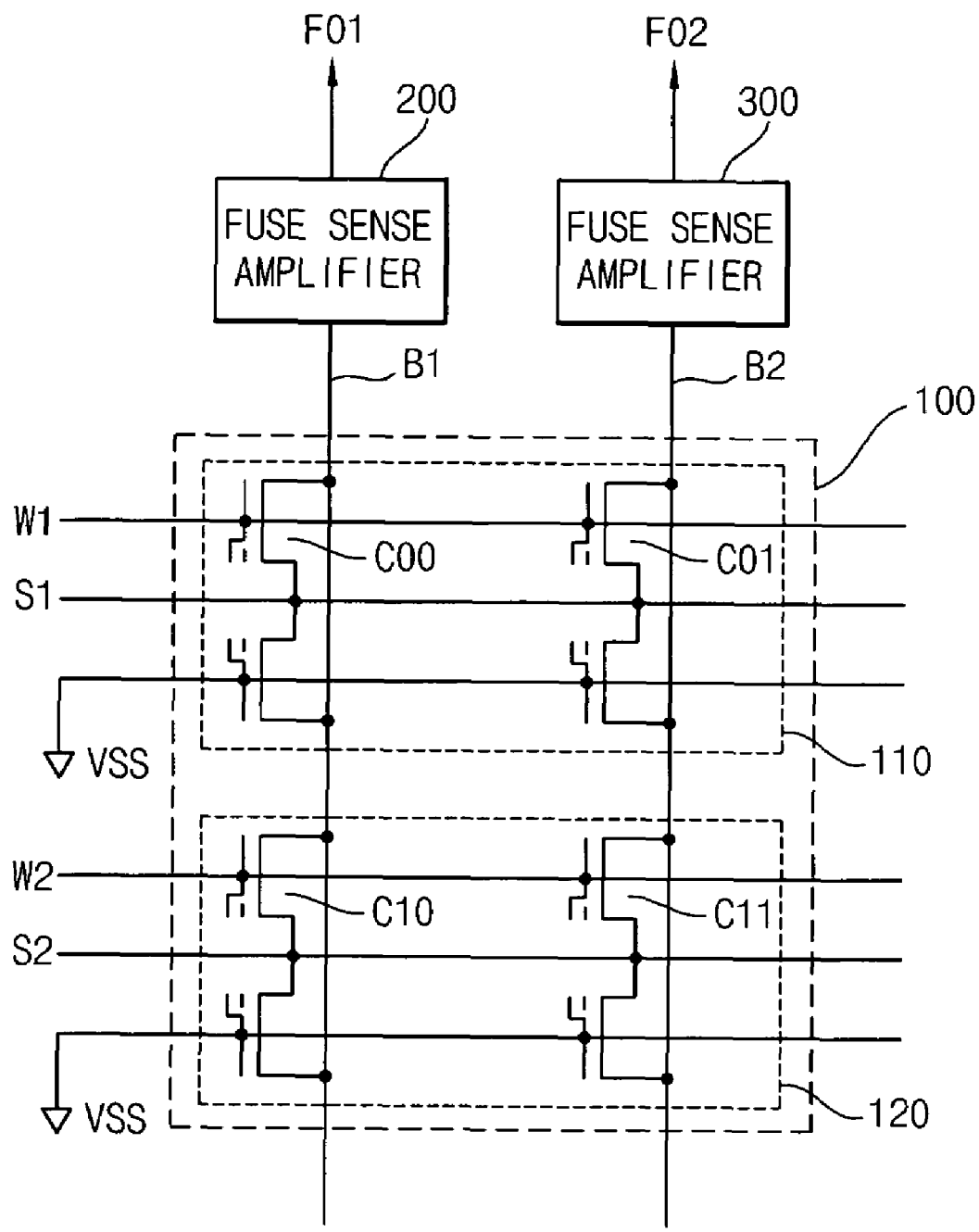
FIG. 1 is a circuit diagram illustrating a conventional flash cell fuse circuit.
Figure 2:
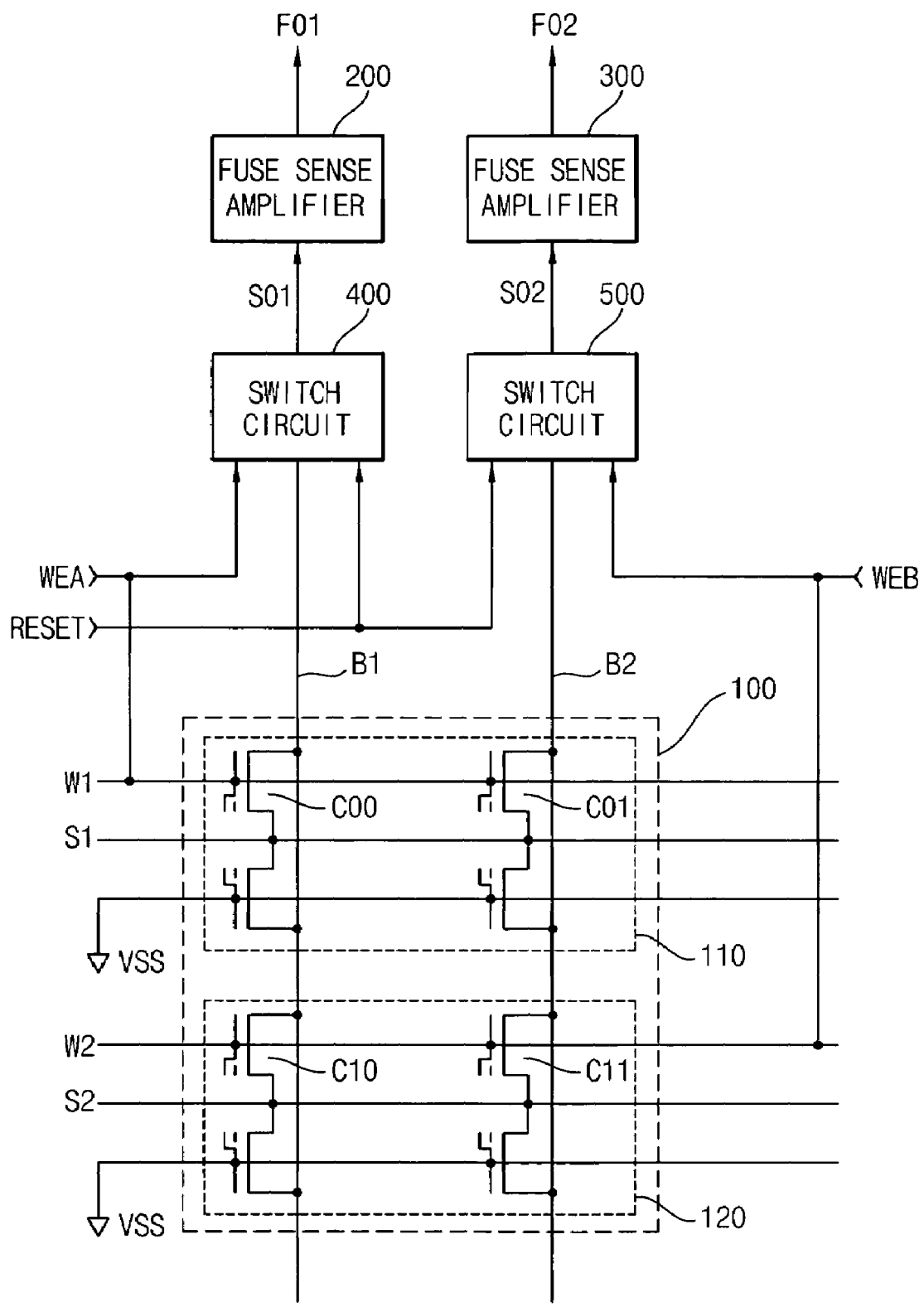
FIG. 2 is a circuit diagram illustrating a flash cell fuse circuit according to an exemplary embodiment of the present invention.

FIG. 2 is a circuit diagram illustrating a flash cell fuse circuit according to an embodiment of the present invention. Referring to FIG. 2, the flash cell fuse circuit includes a fuse cell array 100, first and second switch circuits 400 and 500, and first and second fuse sense amplifiers 200 and 300. The fuse cell array 100 includes a first fuse cell array 110 and a second fuse cell array 120.

The first fuse cell array 110 includes flash cells C00 and C01 and the second fuse cell array 120 includes flash cells C10 and C11. The flash cells C00 and C10 are coupled to a first bit line B1 and the flash cells C01 and C11 are coupled to a second bit line B2. The flash cells C00 and C01 are connected to a source line S1 and the flash cells C10 and C11 are connected to a source line S2. The source lines S1 and S2 are typically coupled to a ground voltage VSS.

A gate of each of the flash cells C00, C01, C10 and C11 is coupled to a corresponding word line W1 or W2 and a drain of each of the flash cells C00, C01, C10 and C11 is coupled to a corresponding bit line B1 or B2.

The fuse cell array 100 executes a program operation and an erase operation on the flash cells C00, C01, C10 and C11 in response to first and second word line enable signals WEA and WEB.

The first switch circuit 400 outputs data of the flash cell C00 through the first bit line B1 in response to the first word line enable signal WEA. The second switch circuit 500 outputs data of the flash cell C11 through the second bit line B2 in response to the second word line enable signal WEB.

The first fuse sense amplifier 200 generates a first fuse signal F01 by detecting and amplifying a first output signal S01 of the first switch circuit 400. The second fuse sense amplifier 300 generates a second fuse signal F02 by detecting and amplifying a second output signal S02 of the second switch circuit 500.

Before describing operations of the flash cell fuse circuit, it is to be understood that the first and second fuse cell arrays 110 and 120 may be used for fusing tasks that are different from each other. For example, the first fuse cell array 110 may generate a fuse signal for substituting a defective cell with a redundancy cell when the defective cell is formed in a flash cell array of a flash memory device, while the second fuse cell array 120 may generate a fuse signal for controlling a DC level of a reference voltage so that the reference voltage, which is required in the flash memory device, may be maintained to have a constant value regardless of procedural or operating variations therein.

The operations of the flash cell fuse circuit of FIG. 2 will now be described.

Referring now to FIG. 2, when the first word line enable signal WEA and a reset signal RESET are in a logic high state and the second word line enable signal WEB is in a logic low state, the flash cell fuse circuit operates as follows.

When the first word line W1 is activated in response to the first word line enable signal WEA, data of the flash cell C00 is transferred to the bit line B1 and data of the flash cell C01 is transferred to the bit line B2. Since both the first word line enable signal WEA and the reset signal RESET are in the logic high state, the first switch circuit 400 outputs the data of the flash cell C00 transferred through the bit line B1. The first output signal S01 of the first switch circuit 400 is output after being detected and amplified by the first fuse sense amplifier 200. Since the second word line enable signal WEB is in the logic low state and the reset signal RESET is in the logic high state, the second switch circuit 500 is turned off, and the data of the flash cell C01 transferred through the bit line B2 is not transferred to the second fuse sense amplifier 300.

Thus, the data of the flash cell C00 is output as the first fuse signal F01 through the first switch circuit 400 and the first fuse sense amplifier 200 when the first word line enable signal WEA and the reset signal RESET are in an enabled state.

When the second word line enable signal WEB and the reset signal RESET are in a logic high state and the first word line enable signal WEA is in a logic low state, the flash cell fuse circuit operates as follows.

When the second word line W2 is activated in response to the second word line enable signal WEB, data of the flash cell C10 is transferred to the bit line B1 and data of the flash cell C11 is transferred to the bit line B2. Since both the second word line enable signal WEB and the reset signal RESET are in the logic high state, the second switch circuit 500 outputs the data of the flash cell C11 transferred through the bit line B2. The second output signal S02 of the second switch circuit 500 is output after being detected and amplified by the second fuse sense amplifier 300. Since the first word line enable signal WEA is in the logic low state and the reset signal RESET is in the logic high state, the first switch circuit 400 is turned off, and the data of the flash cell C10 transferred through the bit line B1 is not transferred to the first fuse sense amplifier 200.

Thus, the data of the flash cell C11 is output as the second fuse signal F02 through the second switch circuit 500 and the second fuse sense amplifier 300 when the second word line enable signal WEB and the reset signal RESET are in an enabled state.

According to the above described operations, the data of one flash cell is transferred through one bit line B1 or B2 in the fuse cell array 100 by sequentially enabling the word line enable signals WEA and WEB. Thus, correct data may be output through the fuse sense amplifiers 200 and 300 by turning on the switch circuits 400 and 500 only when the reset signal RESET and the word line enable signal WEA and WEB are enabled. Using this data, a fusing task may be executed by applying one or both of the fuse signals F01 and F02 to their respective transistor gates in a circuit block that needs to be fused.

Figure 3:
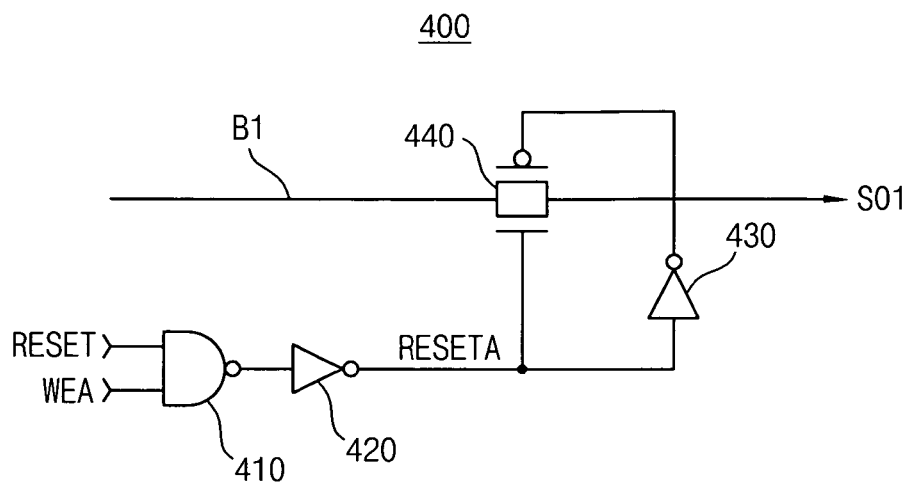
FIGS. 3 and 4 are circuit diagrams illustrating switch circuits included in the flash cell fuse circuit of FIG. 2.
Figure 4:
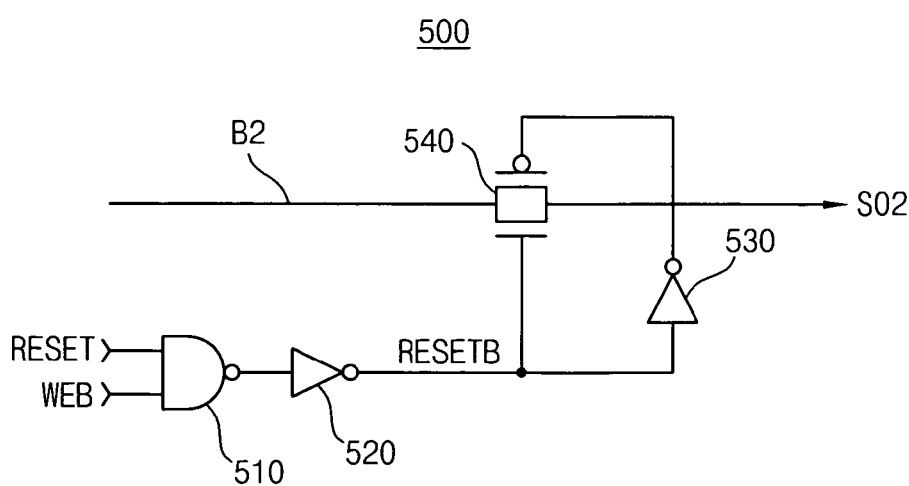

FIGS. 3 and 4 are circuit diagrams illustrating the switch circuits 400 and 500 included in the flash cell fuse circuit of FIG. 2.

Referring to FIG. 3, the first switch circuit 400 includes a NAND gate 410, inverters 420 and 430, and a transfer gate 440. The NAND gate 410 performs a NAND operation on the first word line enable signal WEA and the reset signal RESET. The inverter 420 inverts an output signal of the NAND gate 410, and the inverter 430 inverts an output signal RESETA of the inverter 420. The transfer gate 440 transfers a signal on the bit line B1 to a next stage in response to the output signal RESETA of the inverter 420.

Using the switch circuit as shown in FIG. 3, the data of the fuse cell array on the bit line B1 is output through the transfer gate 440 only when both the first word line enable signal WEA and the reset signal RESET are in the logic high state. Therefore, correct data of a desired flash cell may be detected and output.

Referring to FIG. 4, the second switch circuit 500 includes a NAND gate 510, inverters 520 and 530, and a transfer gate 540. The NAND gate 510 performs a NAND operation on the second word line enable signal WEB and the reset signal RESET. The inverter 520 inverts an output signal of the NAND gate 510, and the inverter 530 inverts an output signal RESETB of the inverter 520. The transfer gate 540 transfers a signal on the bit line B2 to a next stage in response to the output signal RESETB of the inverter 520.

Using the switch circuit as shown in FIG. 4, the data of the fuse cell array on the bit line B2 is output through the transfer gate 540 only when both the second word line enable signal WEB and the reset signal RESET are in the logic high state. Therefore, correct data of a desired flash cell may be detected and output.

Figure 5:
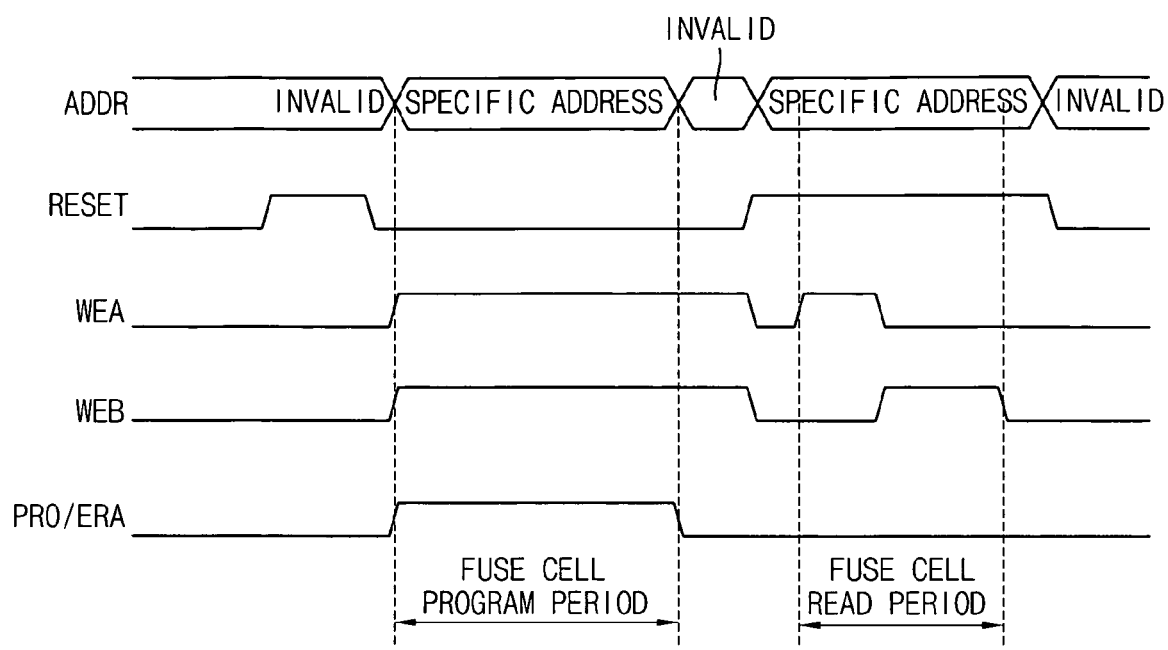
FIG. 5 is a timing diagram illustrating operations of the flash cell fuse circuit of FIG. 2.

FIG. 5 is a timing diagram illustrating operations of the flash cell fuse circuit of FIG. 2, where ADDR refers to an address signal, RESET refers to the reset signal, WEA and WEB refer to the word line enable signals and PRO/ERA refers to a program/erase signal. It is to be understood that the PRO/ERA signal may be set according to a user's intention.

Referring to FIG. 5, in a fuse cell read period, the first word line enable signal WEA and the second word line enable signal WEB are not simultaneously enabled, but sequentially enabled. In other words, in the flash cell fuse circuit of FIG. 2, only data of one cell may be transferred through the bit lines B1 and B2 during a fuse cell read period after the PRO/ERA signal is enabled.

As described above, a flash cell fuse circuit and flash cell fusing method according to an exemplary embodiment of the present invention may be used to prevent flash cells coupled to a common bit line from being simultaneously activated, thereby enabling the output of correct data from a desired cell in a fuse cell array.

Although the flash cell fuse circuit of FIG. 2 has been described as including two bit lines, two switch circuits, and two fuse sense amplifiers, it is to be understood by those of ordinary skill in the art that a flash cell fuse circuit according to an exemplary embodiment of the present invention may include an arbitrary number of bit lines, switch circuits and fuse sense amplifiers. For example, the flash cell fuse circuit may include four bit lines, four switch circuits and four sense amplifiers.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flash cell fuse circuit, comprising:
a fuse cell array configured to output first signals in response to word line enable signals after a program or erase operation;
a plurality of switch circuits configured to pass one of the first signals in response to a reset signal and one of the word line enable signals; and
a plurality of fuse sense amplifiers each configured to generate a fuse signal by detecting and amplifying an output signal of a corresponding switch circuit, wherein each of the switch circuits comprises:
a NAND gate configured to perform a NAND operation on the reset signal and one of the word line enable signals;
an inverter configured to invert an output signal of the NAND gate; and
a transfer gate configured to pass one of the first signals in response to the inverted output signal of the NAND gate.

2. The flash cell fuse circuit of claim 1, wherein the word line enable signals are sequentially enabled.

3. The flash cell fuse circuit of claim 2, wherein the fuse cell array comprises:
a plurality of bit lines;
a plurality of word lines; and
a plurality of flash cells, wherein a gate of each of the flash cells is coupled to a corresponding word line, and a drain of each of the flash cells is coupled to a corresponding bit line.

4. A flash cell fuse circuit, comprising:
a fuse cell array configured to output a first signal and a second signal in response to a first word line enable signal and a second word line enable signal after a program or erase operation;
a first switch circuit configured to pass the first signal in response to a reset signal and the first word line enable signal;
a second switch circuit configured to pass the second signal in response to the reset signal and the second word line enable signal;
a first fuse sense amplifier configured to generate a first fuse signal by detecting and amplifying an output signal of the first switch circuit; and
a second fuse sense amplifier configured to generate a second fuse signal by detecting and amplifying an output signal of the second switch circuit.

5. The flash cell fuse circuit of claim 4, wherein the first and second word line enable signals are sequentially enabled.

6. The flash cell fuse circuit of claim 5, wherein the fuse cell array comprises:
a first bit line;
a second bit line;
a first word line activated in response to the first word line enable signal;
a second word line activated in response to the second word line enable signal;
a first flash cell having a gate coupled to the first word line and a drain coupled to the first bit line; and
a second flash cell having a gate coupled to the second word line and a drain coupled to the second bit line.

7. The flash cell fuse circuit of claim 6, wherein the fuse cell array further comprises:
a third flash cell having a gate coupled to the second word line and a drain coupled to the first bit line; and
a fourth flash cell having a gate coupled to the first word line and a drain coupled to the second bit line.

8. The flash cell fuse circuit of claim 7, wherein a first fuse cell array of the fuse cell array comprises the first flash cell and fourth flash cell and a second fuse cell array of the fuse cell array comprises the second flash cell and third flash cell.

9. The flash cell fuse circuit of claim 4, wherein the first switch circuit comprises:
a NAND gate configured to perform a NAND operation on the reset signal and the first word line enable signal;
an inverter configured to invert an output signal of the NAND gate; and
a transfer gate configured to pass the first signal in response to the inverted output signal of the NAND gate.

10. The flash cell fuse circuit of claim 4, wherein the second switch circuit comprises:
a NAND gate configured to perform a NAND operation on the reset signal and the second word line enable signal;
an inverter configured to invert an output signal of the NAND gate; and
a transfer gate configured to pass the second signal in response to the inverted output signal of the NAND gate.

11. A method of fusing a flash cell, the method comprising:
   outputting first signals in response to word line enable signals after a program or erase operation;
   passing one of the first signals in response to a reset signal and one of the word line enable signals; and
   generating a fuse signal by detecting and amplifying the passed first signal, wherein passing one of the first signals comprises:
   outputting a second signal by performing an AND operation on the reset signal and one of the word line enable signals; and
   passing one of the first signals in response to the second signal.

12. The method of claim 11, wherein the word line enable signals are sequentially enabled.

13. The method of claim 11, further comprising: determining whether the program or erase operation is to be performed.

14. A method of fusing a flash cell, the method comprising:
   outputting a first signal and a second signal in response to a first word line enable signal and a second word line enable signal after a program or erase operation;
   passing the first signal in response to a reset signal and the first word line enable signal;
   passing the second signal in response to the reset signal and the second word line enable signal;
   generating a first fuse signal by detecting and amplifying the passed first signal; and
   generating a second fuse signal by detecting and amplifying the passed second signal.

15. The method of claim 14, wherein the first and second word line enable signals are sequentially enabled.

16. The method of claim 15, wherein passing the first signal comprises:
   outputting a third signal by performing an AND operation on the reset signal and the first word line enable signal; and
   passing the first signal in response to the third signal.

17. The method of claim 15, wherein passing the second signal comprises:
   outputting a fourth signal by performing an AND operation on the reset signal and the second word line enable signal; and
   passing the second signal in response to the fourth signal.

18. The method of claim 14, further comprising:
   determining whether the program or erase operation is to be performed.

* * * * *